(12) United States Patent
Böhne et al.

(10) Patent No.: US 6,989,526 B2
(45) Date of Patent: Jan. 24, 2006

(54) DEVICE FOR THE OPTOELECTRONIC DETECTION OF SWITCHING POSITIONS OF A SWITCHING ELEMENT

(75) Inventors: Gregor Böhne, Castrop-Rauxel (DE); Alfred Palmowski, Hagen (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 65 days.

(21) Appl. No.: 10/882,002

(22) Filed: Jun. 29, 2004

(65) Prior Publication Data

US 2005/0002599 A1      Jan. 6, 2005

Related U.S. Application Data

(63) Continuation of application No. PCT/EP03/02933, filed on Mar. 20, 2003.

(30) Foreign Application Priority Data

Mar. 22, 2002  (DE)  ................................ 102 12 824

(51) Int. Cl.
*H01H 9/00* (2006.01)
(52) U.S. Cl. ................ 250/229; 250/221; 250/214 SW; 200/61.54
(58) Field of Classification Search ........ 250/214 SW, 250/214 PR, 229, 221; 200/61.27, 61.5; 341/31
See application file for complete search history.

(56) References Cited

U.S. PATENT DOCUMENTS

| 5,780,795 A | 7/1998 | O'Reilly |
| 6,080,942 A * | 6/2000 | Sasaki ..................... 200/17 R |
| 6,236,004 B1 | 5/2001 | Stadler |
| 2003/0136655 A1 | 7/2003 | Gerd et al. |

FOREIGN PATENT DOCUMENTS

| DE | 43 32 748 A | 3/1995 |
| DE | 43 36 729 A | 5/1995 |
| DE | 298 17 668 U1 | 10/1998 |
| DE | 199 58 507 A1 | 6/2001 |
| EP | 0 913 940 A | 5/1999 |

* cited by examiner

*Primary Examiner*—Stephone B. Allen
(74) *Attorney, Agent, or Firm*—Brooks Kushman P.C.

(57) ABSTRACT

A device for detecting switching positions of an element movable along a detent curve. The device includes an optical transmitter and an optical receiver. A shutter is between the transmitter and the receiver. The shutter moves relative to the transmitter and the receiver in response to the element moving between switching positions. A light-beam aperture is on the detent curve at a point corresponding to a given switching position such that the light-beam aperture and a shutter aperture of the shutter are aligned when the element is in the given switching position. One of the transmitter and the receiver is positioned behind the detent curve and aligned with the light-beam aperture viewed from the direction of the other of the transmitter and the receiver such that light travels from the transmitter through the light-beam and shutter apertures to illuminate the receiver when the element is in the given switching position.

19 Claims, 3 Drawing Sheets

DEVICE FOR THE OPTOELECTRONIC DETECTION OF SWITCHING POSITIONS OF A SWITCHING ELEMENT

CROSS-REFERENCE TO RELATED APPLICATIONS

This is a continuation of International Application PCT/EP03/02933, published in German, with an international filing date of Mar. 20, 2003, and which claims priority to DE 102 12 824.3 filed on Mar. 22, 2002.

BACKGROUND OF THE INVENTION

1. Field of the Invention

The present invention relates to a device for the optoelectronic detection of switching positions of a mechanically actuated, positively driven switching element that engages in a detent curve in which the device has an optical transmitter positioned to illuminate an optical receiver, and the device further has a shutter which is displaceable relative to the transmitter and the receiver and displaces in response to movement of the switching element between switching positions.

2. Background Art

Devices for the detection of switching positions are used in switches with which a plurality of functions can be switched, and in which the mechanical haptics and electrical switching position detection device are separated. Switches like these are used as lighting or steering column switches in motor vehicles, for example. Such switches are designed to be displaceable in a plurality of directions, so that the numerous functions can be performed independently from each other and parallel to each other. A switching position detection device makes the respective switching position directly accessible to the switched devices, or even as a data input of a data processing system, e.g., an onboard computer in a motor vehicle, for monitoring and control purposes.

In addition, back-lighted symbols can be allocated to the switch for displaying the respective switching position. In this case, the symbols standing for the actually switched functions are back-lighted as a function of the respective switching position.

Such switches are conventionally designed as contact switches, so that a switching position is reached once the switching component has established the corresponding electrical connection. Even though numerous different functions can be switched with such a multifunction switch, the effort increases disproportionately for complicated switch structures if the object is to detect the respective switching positions in the manner described above. In addition, the elements provided for mechanical contacting are subjected to wear and ageing.

As known from DE 43 32 748 A1, multifunction switches can be designed as contact-less, optoelectronically operating switches. The switch described in this document is characterized in an electrical contact is not established to detect a switching position. Rather, a photosensitive element is exposed to light as the receiver with the switching element in a specific switching position. In addition to the photosensitive element, such an optical switch encompasses a light source, e.g., which can be arranged on the same printed circuit board as the photosensitive element.

An optical fiber whose area on the light decoupling side faces the photosensitive surface of the photoelectric element conveys the required light to the photoelectric element. A movement gap is between the decoupling side of the optical fiber and the photoelectric element. A shutter is in the movement gap. The shutter is coupled to the coupled to the displacement of the switching element and moves in the movement gap as the switching element moves between switching positions. The shutter has an opening at a predetermined position, so that, after the switching element has been displaced to a specific switching position, the opening is aligned with the area of the optical fiber on the decoupling side and the photosensitive surface of the photoelectric element, so that the photoelectric element can be exposed to light.

If the switching element is displaced from this position again, the photoelectric element is shaded, and the device moves out of the switching position. Therefore, each switching position is realized by the object of this document by means of an optoelectronic switch. Suitably arranging a plurality of such optical switches also makes it possible to detect complicated switching displacements. However, it is difficult to realize complicated switching displacements in the manner described given tight mounting spaces.

In conceiving this known device, it is necessary that the transmitter and the receiver be precisely aligned relative to each other, in particular when a distinction is to be made as intended between even small make-and-break cycles. Due to the resultant tolerance chains during the manufacture and positioning of photoelectric barrier and the shutter, it can happen that an optical receiver in a specific switching position is not sufficiently irradiated by an optical transmitter after the elements have been installed, e.g., in the housing of a steering column switch, to determine its switching positions, so that there might not be enough illumination intensity for detecting this switching position under certain conditions.

SUMMARY OF THE INVENTION

Proceeding from this discussed prior art, an object of the present invention is to further develop a device for the optoelectronic detection of switching positions of a switching element in such a way as to reduce, if not entirely avoid, the tolerance disadvantages encountered in the prior art.

This object is achieved by two features of the present invention. First, a part of the switching position detection device (i.e., either the optical transmitter(s) or the optical receiver(s)) is positioned behind a section as part of an opaque element forming a detent curve when viewed from the direction of the respective complementary part of the switching position detection device (i.e., the other of the optical transmitter(s) or the optical receiver(s)).

Second, light-beam apertures are incorporated in the section of the opaque element forming the detent curve at individual positions defining the switching points on the detent curve. The light-beam apertures are open or sufficiently transparent relative to the respective complementary part of switching position detection device (i.e., the other of the optical transmitter(s) or the optical receiver(s)). As such, the light-beam apertures define the switching points on the detent curve.

As part of the element forming the detent curve, the light-beam aperture(s) is advantageously fabricated as a single piece with the detent curve, if possible, for example in an injection molding process. Light-beam apertures are respectively incorporated at the positions on the detent curve corresponding to the mechanical switching points, e.g., in a flange that projects from the actual detent curve. Either of the optical transmitters, e.g., LED's, or the optical receivers are positioned behind the light-beam apertures viewed from the direction of the other of the optical transmitters or optical receivers. The light-beam apertures are dimensioned in such a way with respect to their inside diameter that tolerances resulting from the configuration of the elements positioned behind the light-beam aperture (i.e., the elements being either the optical transmitter(s) or the optical receiver(s)) are compensated without any problem.

For example, when an optical transmitter is positioned behind a respective light-beam aperture, the shutter aperture provided by the light-beam aperture is designed to be smaller than the light-emitting surface of such an optical transmitter projected into the plane of the optical receiver. This ensures that the optical receiver can still be illuminated as intended, even when the optical transmitter is positioned behind the light-beam aperture within a certain tolerance. The light-beam apertures and the areas of the detent curve section forming the light-beam aperture also reduce scattered radiation.

The elements of the optical switch assemblies (i.e., the set of optical transmitter(s) and optical receiver(s) forming each optical switch assembly) are preferably positioned on a shared, flexible printed circuit board. The elements (i.e., the optical transmitter(s) and the optical receiver(s)) face each other to form the desired optical switch assemblies in the sections accommodating the optical transmitters and the optical receivers, and are each fixed in a corresponding abutment.

A particularly advantageous embodiment provides for either only one optical receiver and a plurality of optical transmitters, or only one optical transmitter and a plurality of optical receivers to form a light-beam assembly (i.e., an optical switch assembly). At least two optical receivers or two optical transmitters are correspondingly spaced apart by at least one make-and-break cycle in the actuating direction of the switching element. The shutter has a shading area that causes a change only in the respective state of a single optical receiver or only in the state of a single optical transmitter relative to an illumination of the optical receiver given a change in switching positions to an adjacent switching position of the switching element.

In such an embodiment, using a light-beam assembly having an optical transmitter and two optical receivers as an example, essentially four make-and-break cycles can be detected, because a state in which both optical receivers are shadowed can also be defined as a switching position. For this reason, the shutter has a shading area, with which both optical receivers can be shaded at the same time, if required. Therefore, only two optical receivers are necessary in the absence of partial shading for individual optical receivers, so that the number of optical receivers used is reduced by 50% in comparison to the number of required optical receivers in the prior art.

Partial shading can reduce the number of required optical receivers even further in comparison to the prior art. To avoid misinterpretations, the object of the claimed switching position detection device further provides that only a single optical receiver changes its state given a change in the switching position to an adjacent switching position of the switching element. This change in state can be triggered by illuminating a previously unlighted optical receiver or vice versa, or also by changing the illumination intensity, e.g., by shading sections of an optical receiver with the shutter.

Such a switching position detection device can easily also be used to detect a switching position if the switching element can be displaced in two or more directions. An optical receiver assembly consisting of at least two optical receivers and a shutter having its shading area is conceived in each displacement direction of the switching element, as already described above. The lower hardware cost in comparison with the prior art makes it possible to use this type of switching position detection device to optoelectronically detect even complicated switching displacements without a larger installation space being required for this purpose.

A microprocessor is unnecessary for evaluating the switching position detection device in accordance with the present invention. Evaluation can take place via a digital circuit that relays the output signal directly to an apparatus that further processes the output signal of the switching position detection device. For example, such a digital circuit can be a binary decoder.

As shown by this configuration of the switching position detection device in accordance with the present invention, even a plurality of different switching positions is possible at a reduced hardware cost as compared to the prior art.

BRIEF DESCRIPTION OF THE DRAWINGS

The present invention will be described in greater detail below based on a preferred embodiment with reference to the attached figures.

DETAILED DESCRIPTION OF THE PREFERRED EMBODIMENT(S)

Figure 1:
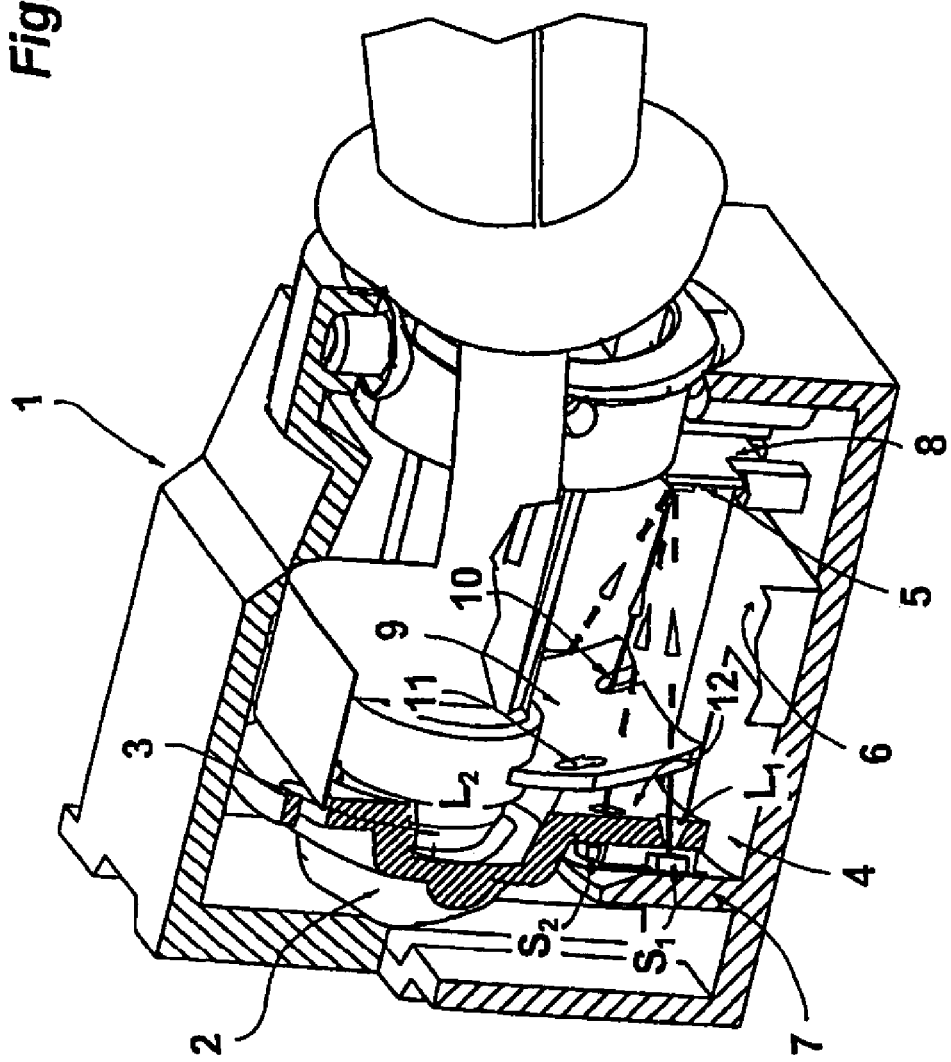
FIG. 1 illustrates a three-dimensional schematic view inside the housing of a steering column switch with a switching ram guided into a detent curve and a device for optoelectronically detecting the switching positions of the switching ram.

A steering column switch for a motor vehicle is incorporated in a housing 1. Housing 1 is part of a steering column module. A detent curve 2 is situated inside housing 1. A spring-loaded switching ram 3 (i.e., a switching element) engages and is guided in detent curve 2. Detent curve 2 engaged by switching ram 3 is used to generate the desired haptics. The individual switching positions of switching ram 3 along detent curve 2 have a haptic, tactile design.

A switching position detection device 4 in accordance with the present invention is used to electrically detect the individual switching positions of switching ram 3 inside detent curve 2. Switching ram 3 moves relative to detent curve 2 in order to move to different switching positions. Switching position detection device 4 operates optoelectronically and includes an optical receiver 5 and a plurality of optical transmitters $S_1$–$S_4$. Optical transmitters $S_1$–$S_4$ are positioned on one side of device 4 to illuminate optical receiver 5 which is positioned on the opposite side of device 4. Optical transmitters $S_1$–$S_4$ and optical receiver 5 together form a light-beam assembly (i.e., an optical switching assembly). Only optical transmitters $S_1$ and $S_2$ are illustrated in FIG. 1.

Optical transmitters $S_1$–$S_4$ are LED's that sequentially emit light beams. Optical receiver 5 is designed as a photodiode. Optical receiver 5 and optical transmitters $S_1$–$S_4$ are positioned together on a flexible printed circuit board 6 and form part of a light-beam assembly (i.e., an optical switch assembly). The desired photoelectric barrier assembly between optical transmitters $S_1$–$S_4$ and optical receiver 5 is formed by abutments 7, 8 molded to housing 1, which have secured to them the printed conductor sections bearing optical receiver 5 and optical transmitters $S_1$–$S_4$ Optical transmitters $S_1$–$S_4$ and optical receiver 5 are fixed in position.

A shutter 9 is connected to switching ram 3 and is positioned between optical receiver 5 on the one side of device 4 and optical transmitters $S_1$–$S_4$ on the other side of device 4. Shutter 9 may be formed as part of switching ram 3. Shutter 9 moves in accordance with the movement of switching ram 3 along detent curve 2 as the switching ram moves between switching positions. As switching ram 3 moves in detent curve 2 between switching points, shutter 9 moves relative to optical transmitters $S_1$–$S_4$ and optical receiver 5 which are fixed in position. In the embodiment shown, shutter 9 includes two shutter apertures 10, 11. Depending on the position of switching ram 3, and hence of shutter 9, all or some individual optical transmitters $S_1$–$S_4$ are shaded, while the light of the remaining optical transmitters $S_1$–$S_4$ pass through shutter apertures 10, 11 or even by the edge of shutter 9 to optical receiver 5 in a given switching position of switching ram 3. Given a change in the switching position of switching ram 3, either a wider light path from one of optical transmitters $S_1$–$S_4$ to optical receiver 5 can be opened, or an already opened light path can be shaded.

In the switching position shown in FIG. 1, optical transmitter $S_3$ illuminates optical receiver 5 as shutter aperture 10 of shutter 9 does not impede the related beam path. By contrast, shutter 9 shades optical receiver 5 against illumination by optical transmitters $S_1$, $S_2$ and $S_4$.

A part of detent curve 2 designed as a plastic injection molded part is a flange 12 that incorporates four light-beam apertures $L_1$–$L_4$ on a part of an opaque element forming the detent curve. Light-beam apertures $L_1$–$L_4$ are conical and taper away from optical receiver 5. Situated immediately behind flange 12 is abutment 7. The section of printed circuit board 6 which carries optical transmitters $S_1$–$S_4$ is secured to abutment 7. Optical transmitters $S_1$–$S_4$ are hence located right in back of light-beam apertures $L_1$–$L_4$ viewed from the direction of optical receiver 5.

A separate light-beam aperture $L_1$–$L_4$ is allocated to each respective optical transmitter $S_1$–$S_4$. The inside diameter in the narrowed section of each light-beam aperture $L_1$–$L_4$ is less than the light-emitting surface of the respective LED $S_1$–$S_4$ projected into the plane of optical receiver 5. Light-beam apertures $L_1$–$L_4$ hence act as a quasi-shutter. The quasi-shutter prevents stray radiation, but in particular makes it possible to orient the light beam of each optical transmitter $S_1$–$S_4$ as intended, directed at optical receiver 5, even if the individual optical transmitters $S_1$–$S_4$ are situated behind light-beam apertures $L_1$–$L_4$ with specific tolerances. Arranging the emitted light beams as intended hence depends on the tolerance of the assembly of light-beam apertures $L_1$–$L_4$. However, the latter can be disregarded, as light-beam apertures $L_1$–$L_4$ or flange 12 with light-beam apertures $L_1$–$L_4$ are part of detent curve 2.

Figure 2:
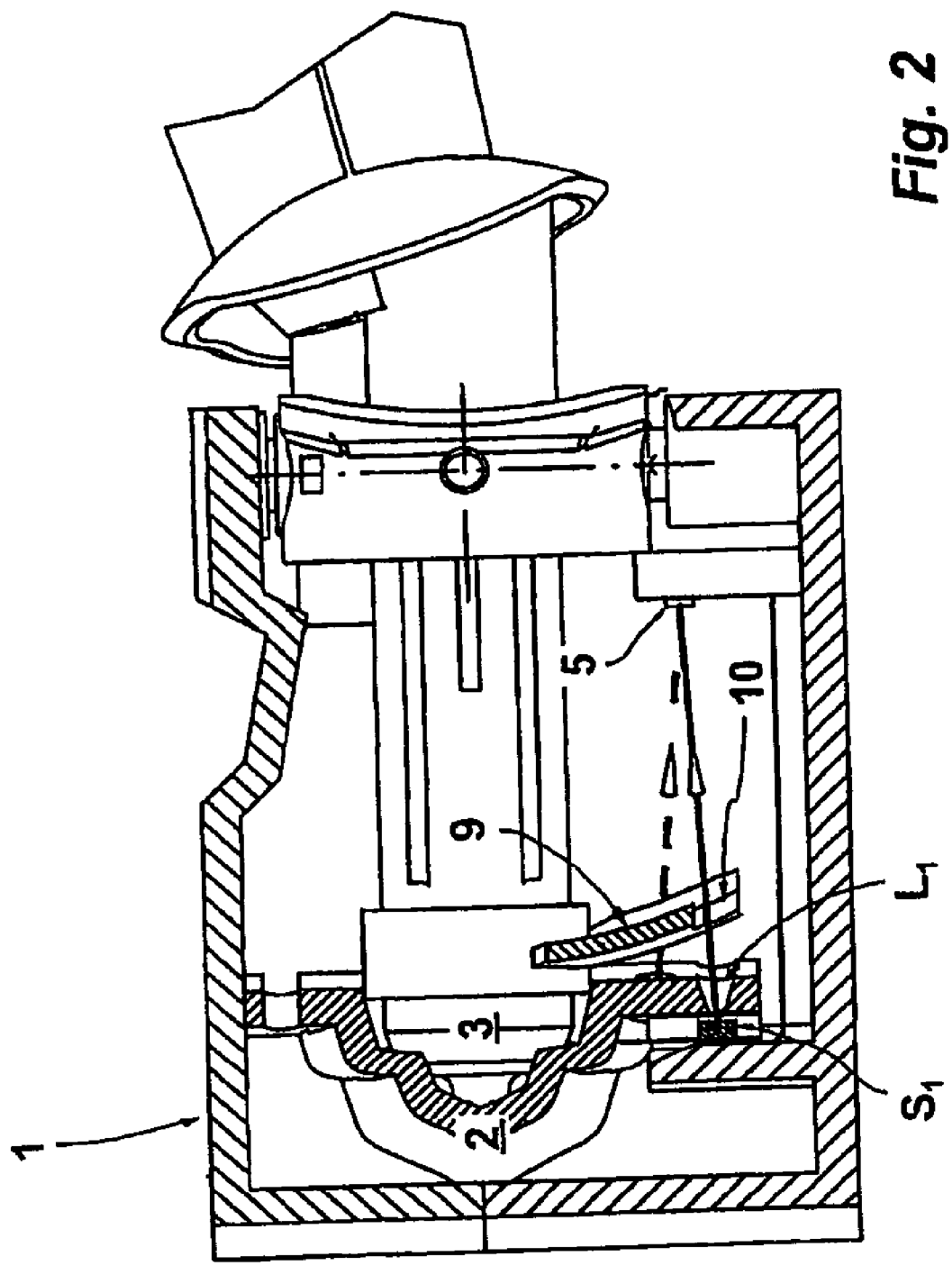
FIG. 2 illustrates a longitudinal view through the housing as shown in FIG. 1.

FIG. 2 illustrates housing 1 of the steering column switch in a longitudinal section. As evident from this assembly, optical transmitters $S_1$–$S_4$ can also be positioned at a varying height relative to optical receiver 5.

Figure 3:
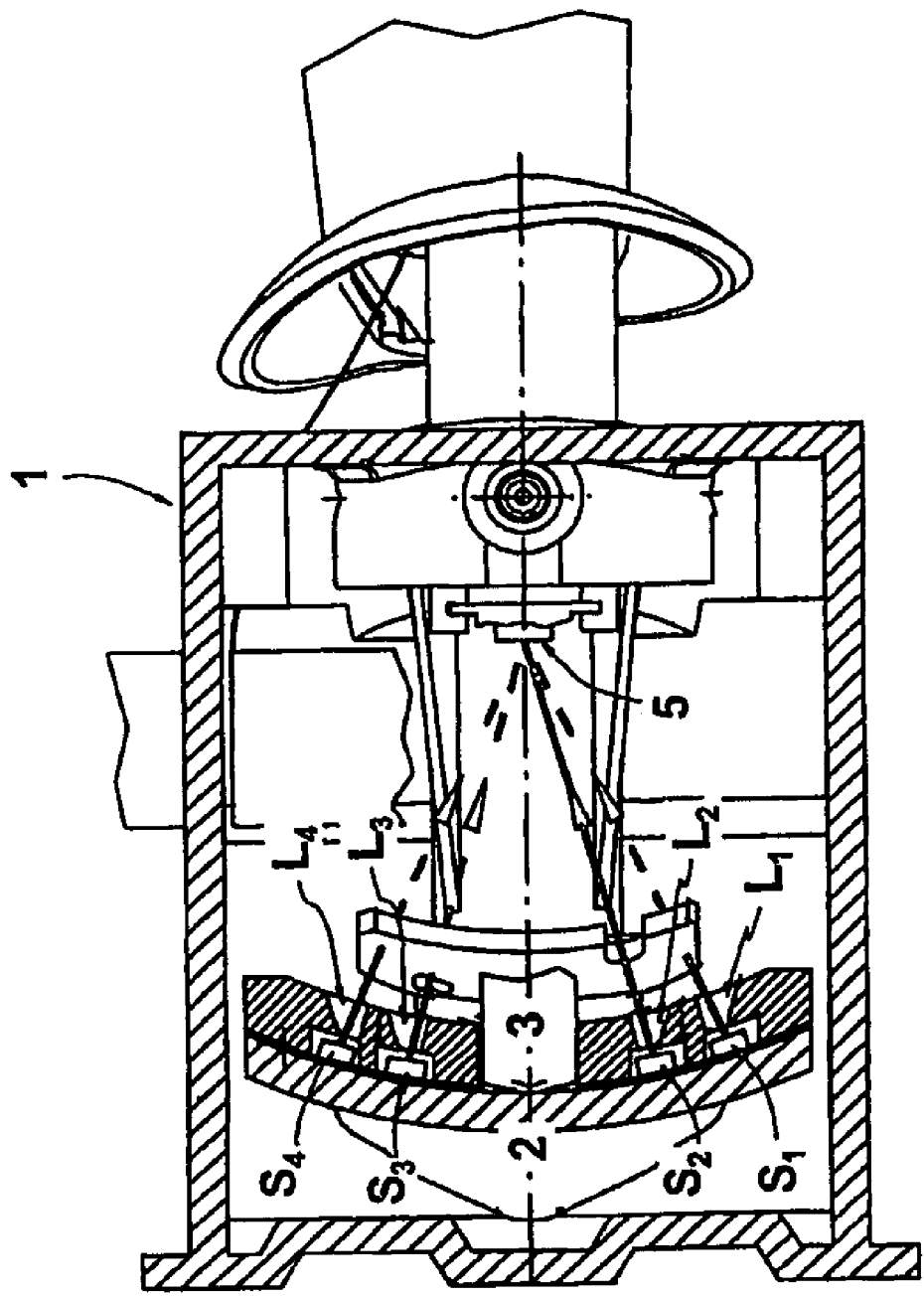
FIG. 3 illustrates a horizontal view through the housing as shown in FIG. 1.

FIG. 3 illustrates the assembly of optical transmitters $S_1$–$S_4$ that are adjacent to the curved abutment. As is also evident, flange 12 of detent curve 2 has recesses for accommodating a respective optical transmitter $S_1$–$S_4$, so that each optical transmitter $S_1$–$S_4$ is quasi-encapsulated, and light can only exit through light-beam apertures $L_1$–$L_4$. This especially helps to avoid stray radiation.

The detection of different switching positions will be described below based on an embodiment in which one optical transmitter and a plurality of optical receivers are provided. The optical receivers are positioned behind the light-beam apertures as part of the detent curve viewed from the direction of the optical transmitter.

The switching element of the switching position detection device is pivoted around two rotational axes. The switching element displacement is coupled with a shutter, which in the embodiment shown consists of a retainer that carries horizontal and perpendicular shading strips. Each shading area is used for detecting the switching position of a respective receiver assembly. A receiver assembly having optical receivers $E_1$ and $E_2$ with the horizontal shading strip lying in front viewed from the position of the optical transmitter is used for switching position determination to ascertain switching element displacement in a y-direction. The other receiver assembly having optical receivers $E_3$–$E_5$ with the perpendicular shading strips lying in front viewed from the position of the optical transmitter is used to determine a switching position of the switching element in an x-direction.

The optical receivers $E_1$, $E_2$ or $E_3$–$E_5$ are each spaced one make-and-break cycle apart respectively. The height of the horizontal shading strip corresponds to two perpendicular make-and-break cycles, while the width of the perpendicular shading strip measures three horizontal make-and-break cycles. Two optical receivers $E_1$, $E_2$ can be used in the y-direction to detect four switching positions. Three optical receivers $E_3$–$E_5$ can be used in the x-direction to detect six switching positions in this embodiment. The states of the individual optical receivers $E_1$–$E_5$ in the different switching positions are specified in the following table:

| y-position | $E_1$ | $E_2$ | x-position | $E_3$ | $E_4$ | $E_5$ |
|---|---|---|---|---|---|---|
| 1 | bright | dark | 1 | bright | bright | dark |
| 2 | dark | dark | 2 | bright | dark | dark |
| 3 | dark | bright | 3 | dark | dark | dark |
| 4 | bright | bright | 4 | dark | dark | bright |
|  |  |  | 5 | dark | bright | bright |
|  |  |  | 6 | bright | bright | bright |

REFERENCE LIST

1 Housing
2 Detent curve
3 Switching ram
4 Switching position detection device
5 Optical receiver
6 Flexible printed circuit board
7 Abutment
8 Abutment
9 Shutter
10 Shutter aperture
11 Shutter aperture
12 Flange
$L_1$–$L_4$ Light-beam apertures
$S_1$–$S_4$ Transmitters While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. An optoelectronic device for detecting switching positions of a switching element, wherein the switching element is movable along a detent curve in order to move between the switching positions, the device comprising:
   a light-beam assembly having an optical transmitter and an optical receiver, wherein the optical transmitter and the optical receiver are fixed in position and the optical transmitter is positioned to illuminate the optical receiver;
   a shutter positioned between the optical transmitter and the optical receiver, the shutter having a shutter aperture, the shutter being coupled to the switching element to be displaced relative to the optical transmitter and the optical receiver in response to the switching element moving along the detent curve between the switching positions; and
   a light-beam aperture formed on the detent curve at a point corresponding to a given switching position of the switching element such that the light-beam aperture and the shutter aperture are in alignment with one another when the switching element is in the given switching position;
   wherein one of the optical transmitter and the optical receiver is positioned behind the detent curve and is aligned with the light-beam aperture viewed from the direction of the other one of the optical transmitter and the optical receiver such that light from the optical transmitter travels through the light-beam aperture and the shutter aperture to illuminate the optical receiver when the switching element is in the given switching position.

2. The device of claim 1 wherein:
   the optical transmitter includes a plurality of optical transmitters which are positioned to illuminate the optical receiver;
   the shutter includes a plurality of shutter apertures and the light-beam aperture includes a plurality of light-beam apertures formed on the detent curve at points corresponding to given switching positions such that corresponding light-beam aperture and shutter aperture pairs are in alignment with one another when the switching element is in corresponding given switching positions;
   wherein the optical transmitters are positioned behind the detent curve and aligned with respective light-beam apertures viewed from the direction of the optical receiver such that light from the optical transmitters travels through the corresponding light-beam aperture and the shutter aperture pairs to illuminate the optical receiver when the switching element is in the corresponding given switching positions.

3. The device of claim 2 wherein:
   the diameter of the light-beam apertures is less than the light-emitting surface of the corresponding optical transmitter projected into the plane of the optical receiver.

4. The device of claim 2 wherein:
   the optical transmitters and the optical receiver are positioned on a printed circuit board.

5. The device of claim 1 wherein:
   the optical receiver includes a plurality of optical receivers which are positioned to be illuminated by the optical transmitter;
   the shutter includes a plurality of shutter apertures and the light-beam aperture includes a plurality of light-beam apertures formed on the detent curve at points corresponding to given switching positions such that corresponding light-beam aperture and shutter aperture pairs are in alignment with one another when the switching element is in corresponding given switching positions;
   wherein the optical receivers are positioned behind the detent curve and aligned with respective light-beam apertures viewed from the direction of the optical transmitter such that light from the optical transmitter travels through the corresponding light-beam aperture and the shutter aperture pairs to illuminate the optical receivers when the switching element is in the corresponding given switching positions.

6. The device of claim 5 wherein:
   the diameter of the light-beam apertures is roughly equal to the surface of the corresponding optical receivers projected into the plane of the optical transmitter.

7. The device of claim 5 wherein:
   the optical transmitter and the optical receivers are positioned on a printed circuit board.

8. The device of claim 1 wherein:
   the light-beam apertures are incorporated in a flange connected to the detent curve.

9. The device of claim 1 wherein:
   the detent curve with the light-beam apertures is a plastic injection-molded part.

10. The device of claim 1 wherein:
    the device is incorporated into a housing of a steering column switch for a motor vehicle.

11. The device of claim 2 wherein:
    at least two optical transmitters are each correspondingly spaced apart by at least one make-and-break cycle in the actuating direction of the switching element, wherein the shutter has a shading area that causes a change in the respective state of one of the at least two optical transmitters relative to an illumination of the optical receiver given a change in switching positions to an adjacent switching position of the switching element.

12. The device of claim 5 wherein:
    at least two optical receivers are each correspondingly spaced apart by at least one make-and-break cycle in the actuating direction of the switching element, wherein the shutter has a shading area that causes a change in the respective state of one of the at least two optical receivers given a change in switching positions to an adjacent switching position of the switching element.

13. The device of claim 1 wherein:
    the switching element is displaceable in two or more directions.

14. The device of claim 1 wherein:
    the switching element is pivoted around one or more axes, wherein the optical transmitter and the optical receiver is positioned in proximity to where the rotational axes intersect, wherein the shutter has a curved surface and the midpoint of the curved surface lies where the rotational axes intersect.

15. The device of claim 1 further comprising:
    a binary decoder switch for directly generating a digital output signal of the optical receiver.

16. The device of claim 1 wherein:
    the optical receiver is a sensor array having a plurality of individual photoelectric receivers.

17. An optoelectronic device for detecting switching positions of a switching element, wherein the switching element is movable along a detent curve in order to move between the switching positions, the device comprising:
- a light-beam assembly having a plurality of optical transmitters and an optical receiver, wherein the optical transmitters and the optical receiver are fixed in position and the optical transmitters are positioned to illuminate the optical receiver;
- a shutter positioned between the optical transmitters and the optical receiver, the shutter having shutter apertures, the shutter being coupled to the switching element to be displaced relative to the optical transmitters and the optical receiver in response to the switching element moving along the detent curve between the switching positions; and
- light-beam apertures formed on the detent curve at points corresponding to given switching positions of the switching element such that corresponding light-beam aperture and shutter aperture pairs are in alignment with one another when the switching element is in the corresponding given switching position;
- wherein the optical transmitters are positioned behind the detent curve and are respectively aligned with the light-beam apertures viewed from the direction of the optical receiver such that light from the optical transmitters travels through the corresponding light-beam aperture and shutter aperture pairs to illuminate the optical receiver when the switching element is in the corresponding given switching position.

18. An optoelectronic device for detecting switching positions of a switching element, wherein the switching element is movable along a detent curve in order to move between the switching positions, the device comprising:
- an assembly having at least one optical receiver and at least one optical transmitter positioned to illuminate the at least one receiver
- a shutter positioned between the at least one transmitter and the at least one receiver, wherein the shutter is displaceable relative to the assembly in response to the switching element moving along the detent curve between the switching positions;
- wherein one of the at least one transmitter and the at least one receiver is positioned behind the detent curve when viewed from the direction of the respective complementary other one of the at least one receiver and the at least one transmitter, and that light-beam apertures are incorporated on the detent curve at points defining the switching positions on the detent curve.

19. The device of claim 18 wherein:
the diameter of the light-beam apertures is less than the light-emitting surface of the corresponding optical transmitter projected into the plane of the corresponding optical receiver.

* * * * *